(12) United States Patent
Kums et al.

(10) Patent No.: US 10,236,429 B2
(45) Date of Patent: Mar. 19, 2019

(54) MOUNTING ASSEMBLY AND LIGHTING DEVICE

(71) Applicant: KONINKLIJKE PHILIPS N.V., Eindhoven (NL)

(72) Inventors: Gerard Kums, Molenstede (NL); Sander Petrus Martinus Noijen, Geldrop (NL)

(73) Assignee: Lumileds LLC, San Jose, CA (US)

( * ) Notice: Subject to any disclaimer, the term of this patent is extended or adjusted under 35 U.S.C. 154(b) by 118 days.

(21) Appl. No.: 15/101,322

(22) PCT Filed: Nov. 24, 2014

(86) PCT No.: PCT/EP2014/075349
§ 371 (c)(1),
(2) Date: Jun. 2, 2016

(87) PCT Pub. No.: WO2015/082237
PCT Pub. Date: Jun. 11, 2015

(65) Prior Publication Data
US 2016/0315240 A1    Oct. 27, 2016

(30) Foreign Application Priority Data
Dec. 6, 2013 (EP) ..................... 13196006

(51) Int. Cl.
*H01L 33/64* (2010.01)
*H01L 33/56* (2010.01)
*H01L 33/62* (2010.01)

(52) U.S. Cl.
CPC ............ *H01L 33/647* (2013.01); *H01L 33/56* (2013.01); *H01L 33/62* (2013.01); *H01L 2224/16245* (2013.01)

(58) Field of Classification Search
None
See application file for complete search history.

(56) References Cited

U.S. PATENT DOCUMENTS 6,949,772 B2 * 9/2005 Shimizu ............... F21L 4/00
257/88
9,449,937 B2  9/2016 Kawakita et al.
(Continued)

FOREIGN PATENT DOCUMENTS

CN    102804428 A    11/2012
CN    102856484 A    1/2013
(Continued)

OTHER PUBLICATIONS

EPO as ISA, International Search Report and Written Opinion dated Mar. 4, 2015 from International Application No. PCT/EP2014/075349, filed Nov. 24, 2014, 13 pages.
(Continued)

*Primary Examiner* — Robert K Carpenter

(57) ABSTRACT

A mounting assembly (10) is disclosed for mounting and connecting an electrical device, in particular a light emitting diode. The mounting assembly (10) comprises a mounting element (12) including at least two metal layers (14, 16) each having a top surface (24) and a bottom surface (28). Top contact pads are formed at the top surface of each of the metal layers for providing a planar electrical and thermal contact to the electrical device. Bottom contact pads are formed at the bottom surface of each of the metal layers for providing a planar electrical and thermal contact to a mounting board (34).

9 Claims, 6 Drawing Sheets

(56) References Cited

U.S. PATENT DOCUMENTS

| | | | |
|---|---|---|---|
| 2004/0159850 A1* | 8/2004 | Takenaka | H01L 24/97 257/98 |
| 2004/0245591 A1 | 12/2004 | Wang et al. | |
| 2006/0186536 A1* | 8/2006 | Hsu | H01L 23/36 257/720 |
| 2011/0012164 A1 | 1/2011 | Kim | |
| 2011/0108866 A1* | 5/2011 | Lee | H01L 33/486 257/98 |
| 2012/0313131 A1 | 12/2012 | Oda et al. | |
| 2013/0001618 A1 | 1/2013 | Imai et al. | |
| 2013/0256733 A1 | 10/2013 | Lin et al. | |

FOREIGN PATENT DOCUMENTS

| | | | |
|---|---|---|---|
| JP | 2003008074 A * | 1/2003 | |
| JP | 2010021374 A | 1/2010 | |
| JP | 2010212352 A | 9/2010 | |
| JP | 2011108998 A | 6/2011 | |
| JP | 2011187552 A | 9/2011 | |
| JP | 2013058695 A | 3/2013 | |
| WO | 2014038128 A1 | 3/2014 | |

OTHER PUBLICATIONS

Extended European Search Report dated Apr. 17, 2014, European Application No. 13196006.4, 8 pages.

First Office Action dated Jan. 3, 2018, China Application No. 201480066642.X, 14 pages.

Office Action dated Sep. 18, 2018, Patent Application No. JP2016-535644, 6 pages.

Second Office Action dated Aug. 24, 2018, CN 201480066642.X, 10 pages.

EP Communication dated Nov. 27, 2018, European Patent Application No. 14802868.1, 10 pages.

* cited by examiner

MOUNTING ASSEMBLY AND LIGHTING DEVICE

CROSS-REFERENCE TO RELATED APPLICATIONS

The present application is a § 371 application of International Application No. PCT/EP2014/075349 filed on Nov. 24, 2014 and entitled "Mounting Assembly and Lighting Device," which claims priority to European Patent Application No. 13196006.4, filed Dec. 6, 2013. Both PCT/EP2014/075349 and 13196006.4 are incorporated herein.

FIELD OF THE INVENTION

The present invention relates to a mounting assembly for mounting and connecting an electrical device, in particular a light emitting diode. Further, the present invention relates to a lighting device comprising a light emitting diode for emitting light.

BACKGROUND OF THE INVENTION

In the field of illumination and in particular in the field of automotive front lighting it is generally known to use light emitting diodes as light sources due to their low power consumption and long lifetime compared to standard filament-based light sources. In order to reduce the size of the lighting devices in general and in order to increase the light emission of lighting devices having LEDs as light sources, the feature size of the light emitting diodes and the corresponding packages is continuously reduced while the power consumption of the LEDs remains constant. Hence, the power density of the light emitting diodes increases and more heat is dissipated by smaller light emitting diode devices and/or light emitting diode packages. This results in a continuously increasing demand for small feature sizes and improved power dissipation properties. This in turn increases the technical effort and the costs of packages and substrates, wherein e.g. ceramics have to be used.

In order to increase the power dissipation of integrated circuits or light emitting diodes, JP 2011-108998 A proposes to connect a backside of an integrated circuit or a light emitting diode laminar to a metal lead frame for dissipating the electrical power, wherein the integrated circuit device or the light emitting diode is connected at the front side by means of wire bonding. The disadvantage of this package concept is that the technical effort of the wire bonding is increased and the size of the light emitting surface is reduced due to the electrical contact pads at the front surface of the electrical device.

US 2004/0245591 discloses a mounting assembly for mounting and connecting an electrical device, in particular a light emitting diode. The mounting assembly comprises a mounting element with two metal layers. The electrical device may be mounted at the top surface of the mounting element, in particular on the top surfaces of the two metal layers, providing electrical and thermal contact between the electrical device and the mounting element. The mounting assembly does not provide for the heat dissipation by and the electric supply to the mounting element.

SUMMARY OF THE INVENTION

It is therefore an object of the present invention to provide a mounting assembly and a lighting device having a small feature size and improved power dissipation with low technical effort.

According to one aspect of the present invention, a mounting assembly for mounting and connecting an electrical device, in particular a light emitting diode is provided, comprising:
a mounting element including at least two metal layers each having a top surface and a bottom surface,
a top contact area or a top contact pad formed at the top surface of each of the metal layers for providing a planar electrical and thermal contact to the electrical device, and further comprising
a bottom contact area or a bottom contact pad formed at the bottom surface of each of the metal layers, wherein the metal layers comprise two distance portions forming different distances between the metal layers, wherein the distance of the top surfaces is smaller than the distance of the bottom surfaces, and
a mounting board, wherein the bottom contact area or bottom contact pad of the mounting element is electrically and thermally connected to the mounting board.

According to another aspect of the present invention a lighting device is provided comprising a light emitting diode for emitting light and a mounting assembly according to the present invention for mounting and connecting the light emitting diode.

Preferred embodiments of the invention are defined in the dependent claims.

The present invention is based on the idea to use the electrical contacts, which are disposed at the backside of the electrical device for electrically connecting the electrical device as well as to thermally connecting the electrical device to a heat sink. Since the mounting element comprises two metal layers which are connected to the electrical device, the power generated in the electrical device can be easily dissipated via the electrical and thermal contacts into the metal layer and further dissipated via the bottom contacts to the mounting board such as a PCB board or ceramic board which is used for mounting the mounting assembly in general. The mounting board forms a heat sink for the electrical device. Hence, the electrical power of the electrical device can be dissipated with low technical effort and the feature size of the electrical device can be further reduced since the electrical contacts are utilized as thermal contacts and provided on the backside of the electrical device.

In a preferred embodiment, the bottom surface is formed at a surface of the metal layers opposite to the top surface. This is a possibility to reduce the feature size and to improve the power dissipation, since the thermal contacts are disposed at opposite sides of the metal layers.

In a preferred embodiment, the bottom surface is formed parallel to the top surface. This is a possibility to reduce the feature size, since the metal layers can be formed as a lead frame and can be assembled in a stack of laminated layers.

In a preferred embodiment, the metal layers are separated from each other by a gap formed between the metal layers. This is a possibility to form electrically separated and isolated contacts which form the thermal and the electrical contacts for the electrical device with low technical effort.

The metal layers comprise two distance portions forming different distances between the metal layers, wherein the distance of the top surfaces of the metal layers is smaller than the distance of the bottom surfaces. This is a possibility to adapt a pitch of the electrical contacts of the electrical device to a different pitch and/or contact distance of the mounting board so that a small feature size and small pitch distance of any electrical device can be adapted to standard pitch and feature sizes of the mounting board.

In a preferred embodiment, the top contact area or the top contact pad and the bottom contact area or the bottom contact pad are respectively overlapping in a vertical viewing direction on the top surface. This is a possibility to further increase the power dissipation from the electrical device to the mounting board, since the respective thermal contacts are overlapping and have a small distance to each other.

In a preferred embodiment, a dielectric layer is disposed on the top surface surrounding the electrical device. This is a possibility to form a compact package for the electrical device and to form a carrier for the metal plates so that a rigid housing can be provided.

In a further preferred embodiment, a metal layer is disposed on a top surface of the dielectric layer surrounding the electrical device. This is a further possibility to increase the stiffness of the mounting assembly so that a rigid housing for the electrical device can be provided.

In a preferred embodiment, the metal layers are metal plates, in particular copper metal plates. This is a possibility to increase the power dissipation due to large thermal capacity of metal plates and in particular the high thermal conductivity of copper.

In a preferred embodiment, the metal layers have a thickness of 210 to 300 micrometers. This is a possibility to reduce the feature size of the mounting assembly.

In a preferred embodiment, the dielectric layer is formed by a glass reinforced epoxy layer. This is a possibility to provide an isolation layer with high thermal stability and low technical effort.

In a preferred embodiment of the lighting device, the light emitting diode comprises contact pads at a surface opposite to a light emitting surface, wherein the contact pads are laminar connected to the top contact area or the top contact pad. This is a possibility to further reduce the feature size of the lighting device, since the electrical and thermal contacts of the light emitting diode are disposed at the back surface of the light emitting diode so that the entire front surface can be used for emitting of the light.

As mentioned above, the present invention provides a mounting assembly or a package assembly for electrical devices which have an improved power dissipation since the electrical contacts, which are formed at the backside of the electrical device serve as electrical and thermal contacts so that the heat generated in the electrical device can be dissipated into the metal layers and can be further dissipated to the connected mounting board. Hence, the power dissipation is improved with low technical effort and the feature size of the electrical device can be reduced since the electrical contacts are formed at the back surface thereof.

BRIEF DESCRIPTION OF THE DRAWINGS

These and other aspects of the invention will be apparent from and elucidated with reference to the embodiment(s) described hereinafter. In the following drawings

DETAILED DESCRIPTION OF THE INVENTION

Figure 1:
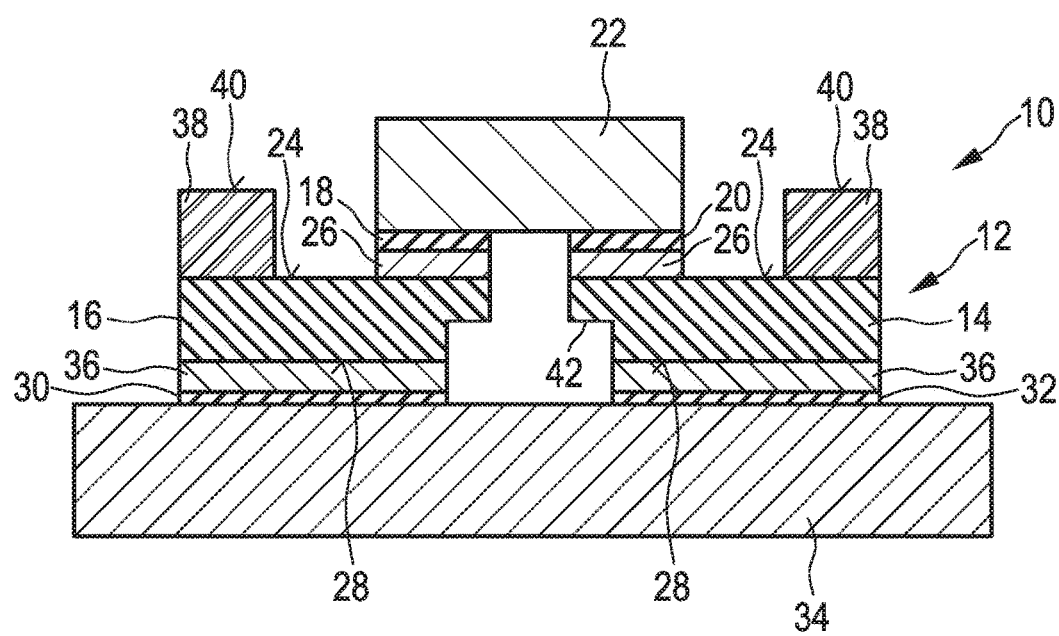
FIG. 1 shows a schematic sectional view of a mounting assembly including a light emitting diode.

FIG. 1 shows a mounting assembly for mounting and connecting an electrical device generally denoted by 10. The mounting assembly comprises a lead frame 12, which is formed by two metal layers 14, 16 or by two metal plates 14, 16. The metal layers 14, 16 are electrically connected to contact pads 18, 20 of an electrical device 22 by means of top contact areas or top contact pads. The contact pads 18, 20 are laminar connected to a top surface 24 of the lead frame 12 or the metal layers 14, 16 by means of a connection material 26 like solder. The lead frame 12 or the metal layers 14, 16 have a bottom surface 28, which is connected by means of bottom contact areas or bottom contact pads to contact pads 30, 32 of a printed circuit board 34 for mounting the mounting assembly and for electrically connecting the mounting assembly 10 in general. The bottom surface 28 is laminar connected to the contact pads 30, 32 by means of a connection material 36 like solder. A dielectric layer 38 is connected to the top surface 24 of the lead frame 12, which surrounds the electrical device 22 and/or receives the electrical device 22 at least partially. The dielectric layer 38 has a top surface 40, which comprises a reflection layer in order to reflect incident light. The dielectric layer 38 forms a cavity for the electrical device 22. The electrical device 22 is preferably a light emitting diode 22 for emitting light.

Since the contact pads 18, 20 of the electrical device 22 are formed as bottom contacts and are laminar connected to the top surface 24 of the lead frame 12, the connection forms a good thermal contact so that thermal power can be dissipated from the electrical device 22 to the metal layers 14, 16 of the lead frame 12. Since the metal layers 14, 16 of the lead frame 12 are laminar connected to the contact pads 30, 32 of the printed circuit board, the thermal energy can be dissipated through the metal layers 14, 16 to the printed circuit board 34, so that the overall power dissipation is improved. Hence, the dimensions of the electrical device 22 can be shrinked while the electrical performance and can remain constant.

The lead frame 12 as shown in FIG. 1 is formed as a pattern lead frame comprising two metal layers 14, 16 disposed in one plane for electrically connecting the electrical device 22 and for providing a heat sink for the electrical power dissipated from the electrical device 22. It shall be understood that the patterned lead frame 12 may comprise more than two metal layers 14, 16 in order to provide a plurality of independent electrical connections for the electrical device 22.

The metal layers 14, 16 are separated by means of a distance or a gap in order to provide an electrical isolation between the metal layers 14, 16. In this certain embodiment, the metal layers 14, 16 have a shoulder 42 or a step 42. By means of the shoulder 42 or the step 42 the distance between the metal layers 14, 16 at the top surface 24 is smaller than the distance between metal layers 14, 16 at the bottom surface 28. By means of these different distances, a different pitch of the contact pads 18, 20 of the electrical device 22 and the contact pads 30, 32 of the printed circuit board 34 can be adapted to each other.

Figure 2:
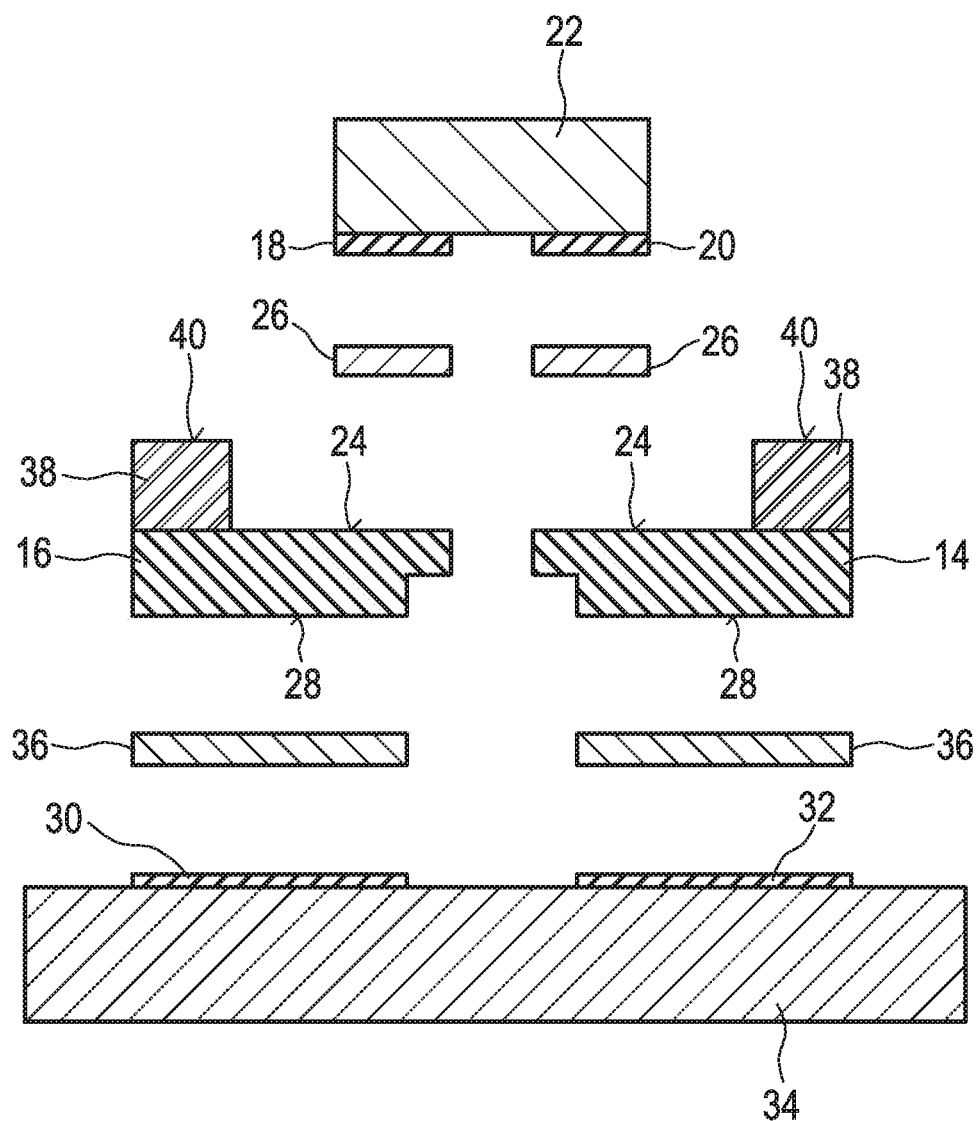
FIG. 2 shows an exploded view of the mounting assembly of FIG. 1.

FIG. 2 shows an exploded view of the mounting assembly 10 of FIG. 1. Identical elements are denoted by identical reference numerals, wherein here merely the differences are explained in detail.

The metal layers 14, 16 have the top surface 24 and the bottom surface 28, which are formed parallel to each other on opposite sides of the metal layers 14, 16. The contact pads 18, 20 of the electrical device 22 are connected laminar by means of the connection material 26 to the top surfaces 24 of each of the metal layers 14, 16 in order to electrically and thermally connect the connection pads 18, 20 to the lead frame 12. The bottom surface 28 of the metal layers 14, 16 are laminar connected to the connection pads 30, 32 of the printed circuit board by means of the connection material 36 so that the metal layers 14, 16 are electrically and thermally connected to the printed circuit board 34. Hence, the power dissipation of the electrical device 22 can be improved, since the contact pads 18, 20 are used to electrically connect the electrical device 22 and for thermal power dissipation so that the thermal power of the electrical device 22 can be dissipated and an improved cooling of the electrical device 22 can be achieved.

Figure 3A:
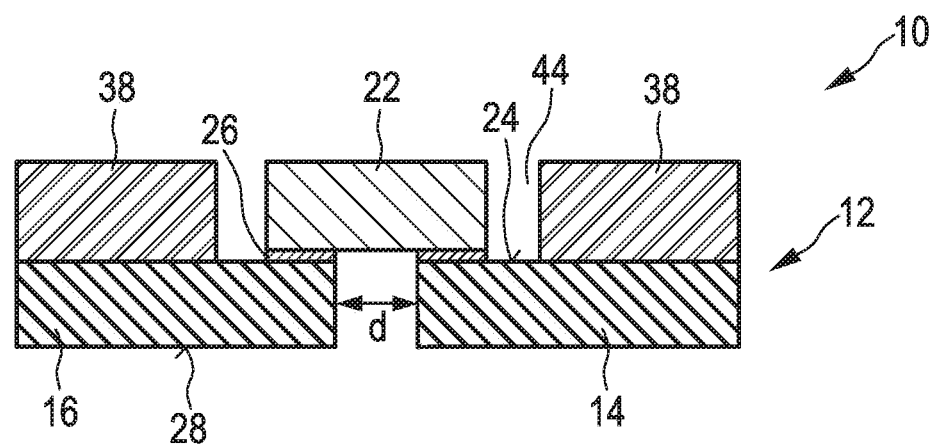
FIGS. 3a, b show sectional views of embodiments of the mounting assembly.

FIG. 3a shows an embodiment of the mounting assembly 10. Identical elements are denoted by identical reference numerals, wherein here merely the differences are explained in detail.

The lead frame 12 comprises the two metal layers 14, 16 disposed in one plane, wherein a distance d between the metal layers 14, 16 is identical at the top surface 24 and the bottom surface 28. The dielectric layer 38 is connected to the top surface 24 in order to form a cavity 44, in which the electrical device 22 is disposed. The distance d forms a pitch between the contact pads 18, 20 of the electrical device 22 and the contact pads 30, 32 of the printed circuit board 34, wherein this lead frame 12 can be used for identical pitches of the electrical device 22 and the printed circuit board 34.

Figure 3B:
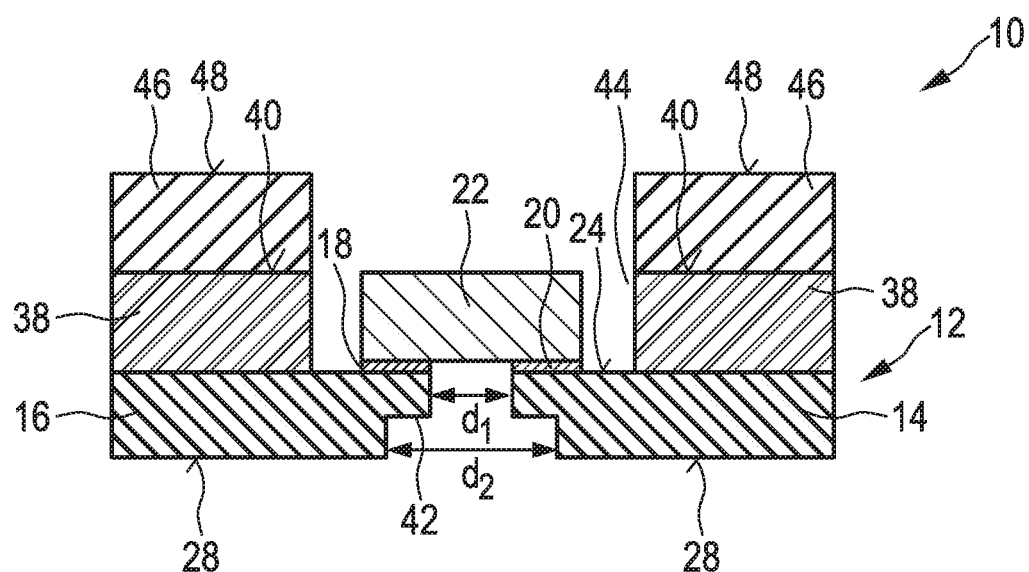

FIG. 3b shows a further embodiment of the mounting assembly 10. Identical elements are denoted by identical reference numerals, wherein here merely the differences are explained in detail.

The metal layers 14, 16 which are disposed in one plane comprise the shoulder 42 or the step 42 so that the top surfaces 24 of the metal layers 14, 16 are disposed in a first distance $d_1$ and the bottom surfaces 28 of the metal layers 14, 16 are disposed in a second distance $d_2$. The first distance $d_1$ is smaller than the second distance $d_2$ so that a large pitch of the contact pads 30, 32 of the printed circuit board 34 (not shown in FIG. 3b) can be adapted to a small pitch of the contact pads 18, 20 of the electrical device 22.

A second lead frame 46 is connected to the top surface 40 of the dielectric layer 38 in order to provide a mechanical reinforcement of the mounting assembly 10 in general, wherein the reflected functionality of the mounting assembly 10 is provided at a top surface 48 of the lead frame 46. Hence, a mechanical stabilization of the mounting assembly 10 can be achieved with low technical effort, wherein the reflective function of the mounting assembly 10 is provided by the top surface 48. The lead frame 46 comprises a recess or an opening, which is identical with the recess of the dielectric layer 38 or larger than the recess of the dielectric layer 38 so that the cavity 44 can be formed for receiving the electrical device 22.

Figure 4:
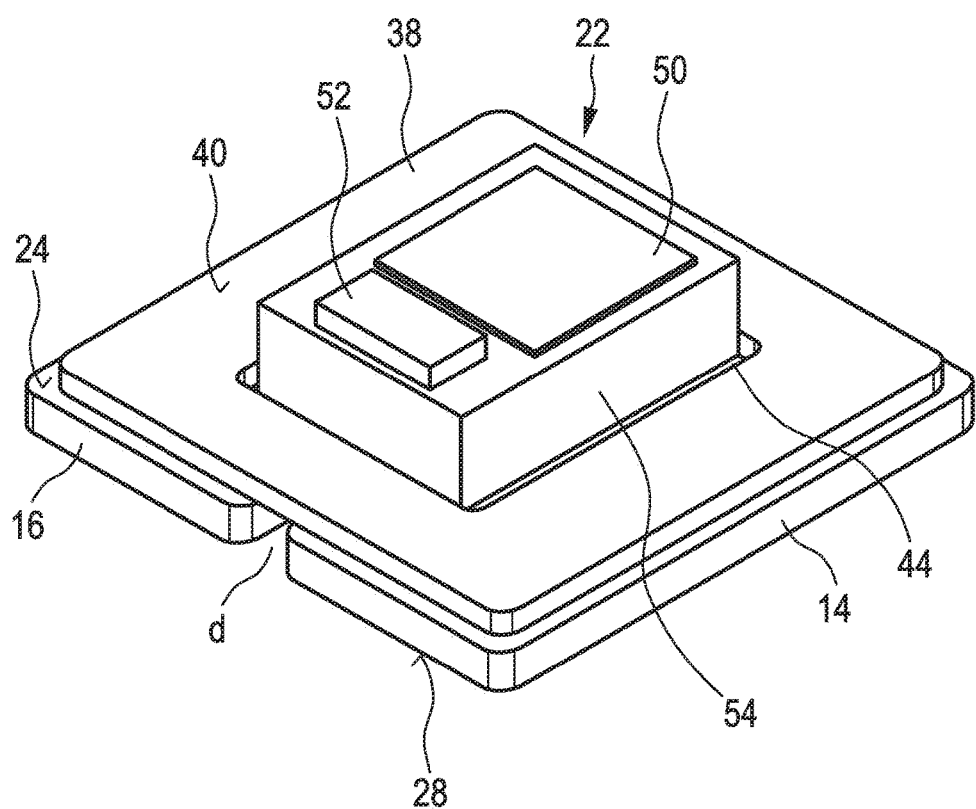
FIG. 4 shows a perspective drawing of the mounting assembly including a light emitting diode.

In FIG. 4, a perspective view of the mounting assembly 10 and the electrical device 22 is schematically shown. Identical elements are denoted by identical reference numerals, wherein here merely the differences are explained in detail.

The metal layers 14, 16 are formed as metal plates 14, 16, in particular as copper plates 14, 16 for receiving and conducting the heat dissipated by the electrical device 22. The metal plates 14, 16 are disposed side by side in one plane. The dielectric layer 38 is connected laminar to the top surface 24 of the metal layers 14, 16 and forms the cavity 44, in which the electrical device 22 is disposed. The dielectric layer 38 is preferably formed by a glass reinforced epoxy layer or a polyimide dielectric layer, wherein the top surface 40 comprises a white reflective layer and/or a protection layer in order to reflect incident light and to protect the lead frame 12 in general. The metal layers 14, 16 have preferably a thickness of 210 to 300 micrometers in order to provide a good thermal conductivity and a large thermal capacity to compensate peaks in the power dissipation of the electrical device 22. The electrical device 22 comprises an LED unit 50 and a TVS diode 52 which are connected to a ceramic carrier 54, which is disposed within the cavity 44 and connected to the metal layers 14, 16 in order to electrically and thermally connect the LED 50 and the TVS diode 52 to the lead frame 12.

Figure 5A:
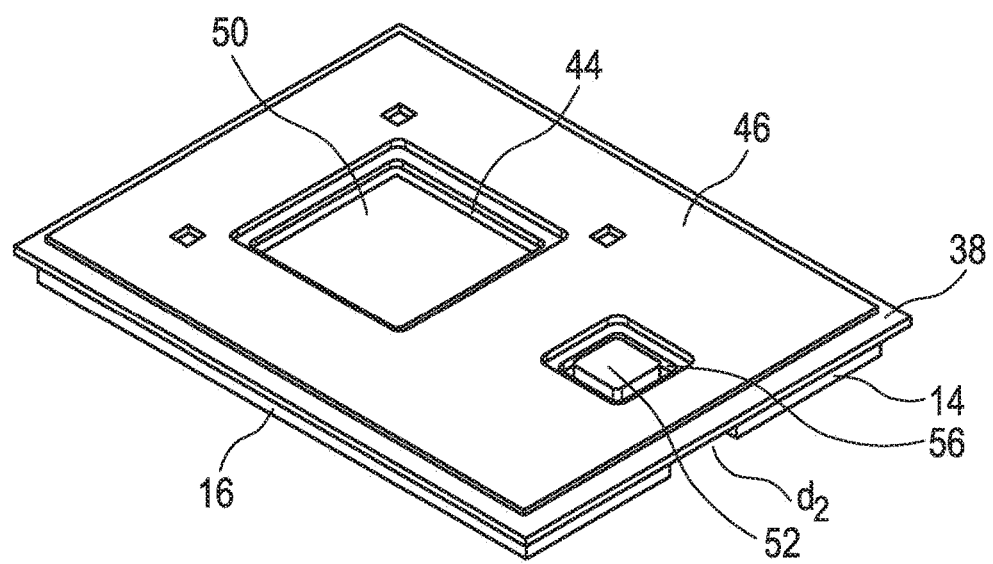
FIGS. 5a, b show a perspective drawing and an exploded view of an embodiment of the mounting assembly.

FIG. 5a shows a perspective view of an embodiment of the mounting assembly 10. Identical elements are denoted by identical reference numerals, wherein here merely the differences are explained in detail.

The mounting assembly 10 comprises the dielectric layer 38 and the lead frame 46 formed as a copper layer, wherein two cavities 44 and 56 are formed in the dielectric layer 38 and the lead frame 46 in order to receive the LED 50 and the TSV diode 52.

Figure 5B:
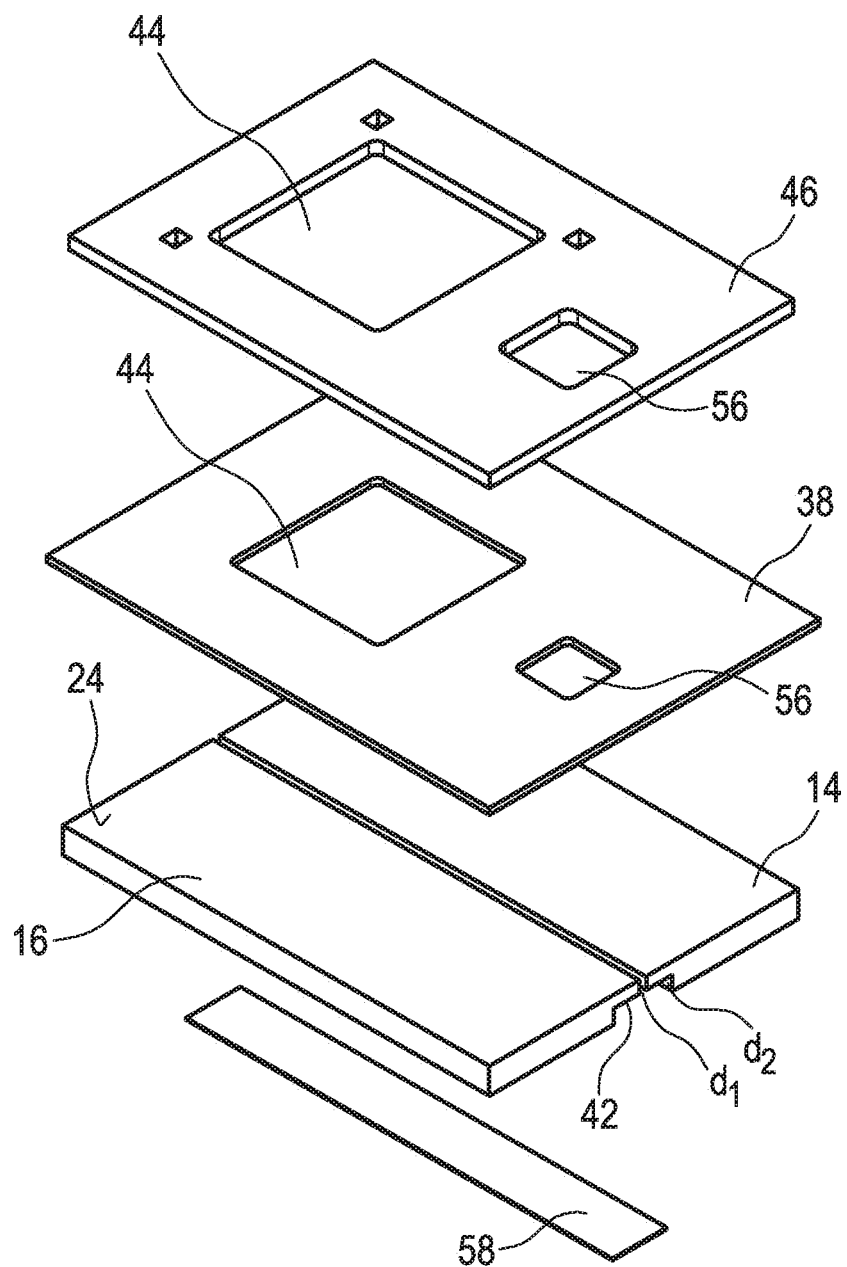

FIG. 5b shows an exploded view of the mounting assembly 10 shown in FIG. 5a. The metal layers 14, 16 are separated by a distance, wherein the step 42 is formed in each of the metal layers 14, 16 so that the top surfaces 24 of the metal layers 14, 16 are separated by the first distance $d_1$ and the bottom surfaces 28 are separated by the second distance $d_2$. In the slit or the distance between the metal layers 14, 16 an isolation element 58 is disposed in order to prevent solder from the connection of lead frame 12 to the PCB board 34 to flow into the gap between the metal layers 14, 16 in order to prevent short circuits. The isolation element 58 is formed as a filling or a sealing.

Hence, the different layers can be laminated to each other in order to provide the mounting assembly 10 with low technical effort and low costs.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A lighting device, comprising:
a light emitting diode comprising contact pads at a surface opposite to a light emitting surface;

a mounting assembly, comprising:
- a lead frame comprising:
  - at least two metal plates each having a top surface and a bottom surface, the metal plates being disposed in one plane and comprising opposing shoulders so top surfaces of the metal plates are disposed in a first distance (d1) apart and bottom surfaces of the metal plates are disposed in a second distance (d2) apart that is larger than the first distance (d1);
  - a top contact area or a top contact pad formed at the top surface of each of the metal plates, the top contact areas or the top contact pads being laminarly connected to the corresponding contact pads of the light emitting diode; and
  - a bottom contact area or a bottom contact pad formed at the bottom surface of each of the metal plates;
- a dielectric layer disposed on the top surfaces of the metal plates and surrounding the electrical device, the dielectric layer forming a carrier for the metal plates to provide a rigid housing; and
- a mounting board comprising a printed circuit board or a ceramic board, the mounting board having top contact pads laminarly connected to the corresponding bottom contact areas or the corresponding bottom contact pads of the lead frame.

2. The device as claimed in claim 1, wherein the bottom surface is formed at a surface of the metal plates opposite to the top surface.

3. The device as claimed in claim 1, wherein the bottom surface is formed parallel to the top surface.

4. The device as claimed in claim 1, wherein an isolation element is disposed in the gap between the metals plates.

5. The device as claimed in claim 1, wherein the top contact area or top contact pad and the bottom contact area or the bottom contact pad are respectively overlapping in a vertical viewing direction on the top surface.

6. The device as claimed in claim 1, further comprising a second lead frame disposed on a top surface of the dielectric layer surrounding the electrical device.

7. The device as claimed in claim 1, wherein the metal plates have a thickness of 210 to 300 micrometers.

8. The device as claimed in claim 1, wherein the dielectric layer is formed by a glass reinforced epoxy layer.

9. The device as claimed in claim 1, wherein the metal plates each comprises larger dimensions than the electrical device.

* * * * *